United States Patent [19]

Pedroni et al.

[11] Patent Number: 5,724,269
[45] Date of Patent: Mar. 3, 1998

[54] SINGLE CLOCK CYCLE TWO-DIMENSIONAL MEDIAN FILTER

[75] Inventors: Volnei A. Pedroni, Pasadena; Amnon Yariv, San Marino, both of Calif.

[73] Assignee: California Institute of Technology, Pasadena, Calif.

[21] Appl. No.: 514,626

[22] Filed: Aug. 14, 1995

[51] Int. Cl.[6] ..................................................... G06F 17/00
[52] U.S. Cl. ...................................... 364/572; 364/724.01
[58] Field of Search ............................. 364/572, 715.01,
364/724.01–724.2, 607, 825, 606; 365/102,
104, 49; 333/166

[56] References Cited

U.S. PATENT DOCUMENTS

| | | | |
|---|---|---|---|
| 4,672,567 | 6/1987 | Kelly et al. | 364/572 |
| 4,713,786 | 12/1987 | Roskind | 364/715 |
| 4,928,258 | 5/1990 | May | 364/724.17 |
| 4,951,242 | 8/1990 | Hobson | 364/715.01 |
| 5,138,567 | 8/1992 | Mehrgardt | 364/724.01 |
| 5,414,663 | 5/1995 | Komarek et al. | 365/210 |

*Primary Examiner*—Edward R. Cosimano
*Assistant Examiner*—Demetra R. Smith
*Attorney, Agent, or Firm*—Fish & Richardson, P.C.

[57] ABSTRACT

A median circuit operates over a single-clock-cycle to determine the median of the group. Each value is compared with a plurality of other values. One of those other values become the eventual median. The possible median which is closest to all of the elements being compared is taken as the overall closest value and established as the median. Most specifically, this is done by applying the higher voltage of the pair to one end of a capacitor at the same time as a precharge. After the precharge is complete, the lower voltage of the pair is applied to the capacitor. The capacitor acts as a charge pump, lowering its other end by an amount proportional to the distance between the higher voltage of the pair and the lower voltage of the pair. A plurality of the capacitors are connected together, so that the output from the group of cells represents the average capacitors among all elements. The highest group represents the eventual median.

13 Claims, 5 Drawing Sheets

SINGLE CLOCK CYCLE TWO-DIMENSIONAL MEDIAN FILTER

STATEMENT OF GOVERNMENT RIGHTS

The U.S. Government may have certain rights in this invention pursuant to Grant No. 00014-92-J-1891 awarded by the Navy.

FIELD OF THE INVENTION

The present invention relates to an analog two-dimensional median filter, which finds the median among a plurality of values and does so over a single clock cycle.

BACKGROUND AND SUMMARY OF THE INVENTION

Median filters are used in modern image processing applications to remove impulsive noise from an image. A median filter in general finds the central element or median of an ordered set.

One application of a median filter, for example, is in a real life image which has impulsive noise from part of the real life scene. This kind of noise can be reduced by investigating the image by block pixels. Each group of pixels around one pixel can be replaced by the median of the block. This minimizes the effect of the noise on the overall image. However, an NxN block usually requires $N^2$ calculations. For instance, blocks of size 5×5 requires each pixel requires at least 25 computation cycles. Standard median filters are described in P. Wendt, E. Coyle, C. Gallagher, "Stack filters," IEEE Trans. Acoustics, Speech, and Signal Proc., pp. 898–911, 1986; and O. Yli-Standard median filters are described in P. Wendt, E. Coyle, C. Gallagher, "Stack filters," IEEE Trans. Acoustics, Speech, and Signal Proc., pp. 898–911, 1986; and O. Yli-Harja, J. Astola, Y. Neuro, "Analysis of the properties of median and weighted median filters using threshold logic and stack filter representation." IEEE Trans. Signal Proc., pp. 395–410, 1991. FIG. 1 shows an example of a conventional median filter implementation. This digital typical median filter relies on threshold decompositions of the M valued components of the data block into M−1 binary streams, each of length N. Each of the streams are binary-filtered and later added together.

Such a system requires, moreover, that each input signal be thresholded multiple times. It also requires multiple investigations which must take place over multiple clock cycles. The number of clock cycles inevitably increases when larger data blocks are used.

Another conventional way to find the median among the number of values requires storing all the values in a register and then ordering them. However, this means that the values cannot even begin to be processed until completely clocked into the register. This is also inevitably a slow operation.

It is an object of the present invention to obviate these problems by providing a much faster median filter, and preferably one which can carry out its operation over a single clock cycle. This is done according to the present invention by applying various values to absolute distance cells, and using these values to determine which value has an average deviation which deviates in the least from all the other values by the lowest average amount.

BRIEF DESCRIPTION OF THE DRAWING

These and other aspects of the invention will now be described in detail with reference to the accompanying drawings, wherein.

DESCRIPTION OF THE PREFERRED EMBODIMENTS

Given a real-valued set $X=\{X_1, X_2, \ldots, X_N\}$, the median of X can be computed as $$\text{med}(X) = \min_{j} \left\{ \sum_{i=1}^{N} |X_j - X_i| \right\} \quad (1)$$

Conceptually, this means that each value is compared with all the other values in the set. The value which has the least absolute difference from all the other values in the set is the median.

The present inventor has realized that this feature can be carried out in the analog domain using analog circuitry and has developed a particularly preferred way to embody this function. More generally, moreover, each value of the set need not necessarily be compared with all other values in the set but rather can be compared with any set of values which might approximate the median.

Figure 2:
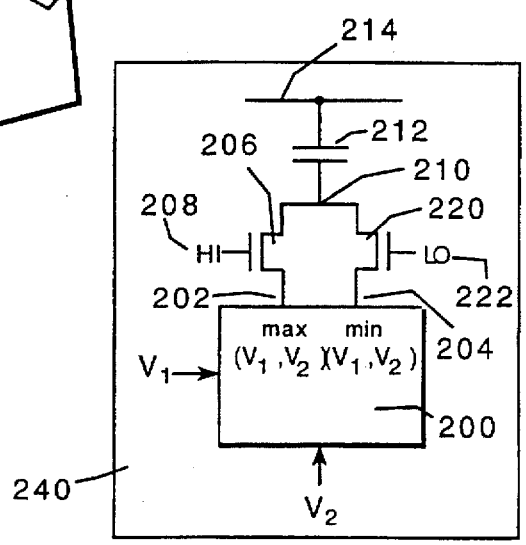
FIG. 2 shows a cell of an absolute value cell.

FIG. 2 shows an absolute distance cell used to carry out the single clock cycle implementation of the present invention. Maximum/minimum circuit 200 receives the voltage inputs $V_1$ and $V_2$, and determines which is larger. The higher output is produced at output 202, and the lower output is produced at 204. These outputs are switched to an averaging capacitor 212 using field effect transistors or the like as a switching mechanism. Switch 206 is changed in state based on the "HI" control input 208. When the "HI" control is active, the maximum among the two input voltages $V_1$, $V_2$ is output to the common node 210, and coupled through capacitor 212 to voltage line 214. Analogously, switch 220 switches the minimum voltage based on the control signal LO 222. The circuit therefore allows the maximum output 202 and the minimum output 204 to be independently selected using the HI and LO input control signals.

Figure 1:
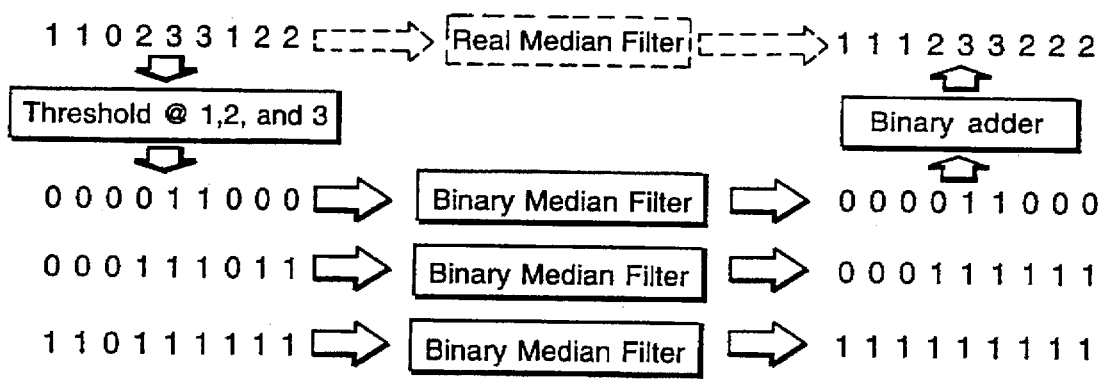
FIG. 1 shows a prior art conventional median filter.
Figure 3:
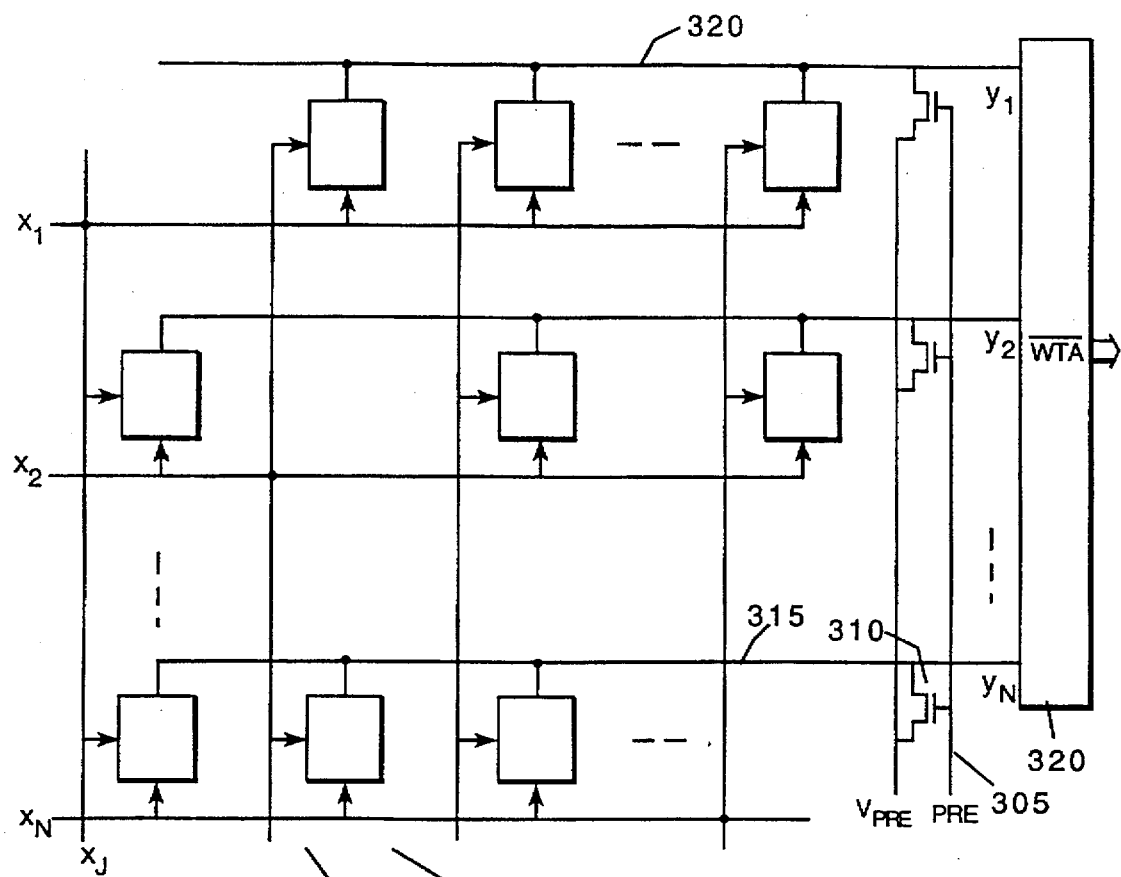
FIG. 3 shows how those absolute value cells are interconnected to form the analog median value circuit of the present invention.

The overall circuit of FIG. 3 uses an array of the FIG. 2 circuitry elements. Each circuitry element 300 receives two input signals $X_j$ and an $X_i$. $X_i$, where i varies between one and N, corresponds to the input set of which the median is to be determined, i.e., $X_1, X_2 \ldots X_N$. $X_j$ corresponds to the set of possible medians. $X_j$ is preferably the same set as $X_i$, so the circuit of FIG. 3 preferably compares each value $X_i$ of the input set with all the other values in the set, i.e., $X_1, X_2, \ldots, X_{i-1}, X_{i+1}, \ldots, X_N$.

Figure 4:
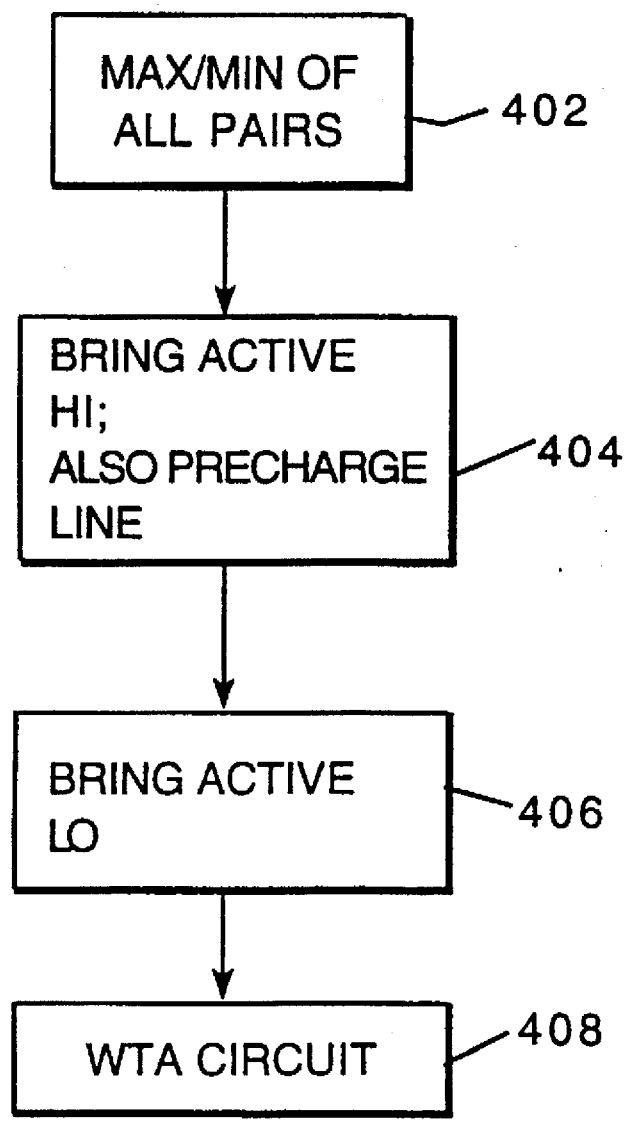
FIG. 4 shows a supervisory flowchart according to the present invention.

The overall operation of the system is described with reference to the flowchart of FIG. 4. It should be understood that this flowchart can be carried out by a supervisory processor, or by hardware operations.

Each node of the circuit as shown in FIGS. 2 and 3 receives two values $X_i$ and $X_j$ to be compared. The minimum/maximum circuit 200 compares the two values to detect the higher and the lower values, shown in the flowchart as step 402.

The absolute difference is computed by first bringing active the HI line at step 404. This has the effect of connecting the maximums from all of the circuits to one end of the associated averaging capacitor 212. At the same time, the precharge command PRE is brought active by applying a high value on line 305. This has the effect of turning on the transistors 310 etc. thus applying the voltage $V_{PRE}$ to each of the voltage lines 315 and to the other end of each capacitor 212.

After appropriately precharging the line 315, the HI and PRE control values are brought inactive. LO is then brought active on each cell at 406. This lowers the voltage on the bottom plate of each averaging capacitor 212 by $V_h-V_l$. Since the voltage across the capacitor cannot instantaneously change, the voltage on the top plate is also lowered by the amount $V_h-V_l$. All of the capacitors in a row are connected together, however, and hence the voltage on any row 315 depends on the average of the absolute differences between the samples applied to all elements of the row. Since the voltage can only be lowered, the highest row voltage represents the closest pair, and hence the median value.

The row which has the smallest set of overall differences between $X_i$ and $X_j$ presents the smallest summation. This row will stay closest to its initial level, and hence will have the highest overall level. Winner-take-all circuit 320 detects the line which has the highest voltage thereon, for instance by detecting the highest among its input voltages. The row input of the winner-take-all circuit hence identifies the median of the data set. This circuit allows the operation to take place over a single clock cycle.

Figure 5:
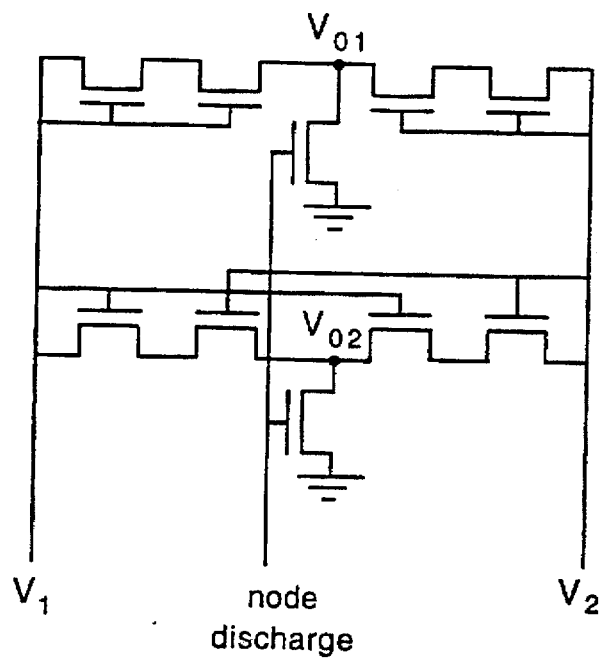
FIGS. 5 and 6 show absolute distance cell implementations.

The circuitry components described above are explained herein in more detail. The absolute distance cell calculates the absolute distance between two values $X_j$ and $X_i$. The present invention produces the final voltage on the row line which is proportional to the total absolute distance of the corresponding row of absolute distance cells. FIG. 5 shows a first embodiment of the absolute distance cell 200. In FIG. 5, the node discharge turns on the system, causing the voltage at $V_{O1}$ to become proportional to the highest among $V_1$ and $V_2$, while $V_{O2}$ becomes proportional to the lowest among $V_1/V_2$.

Figure 6:
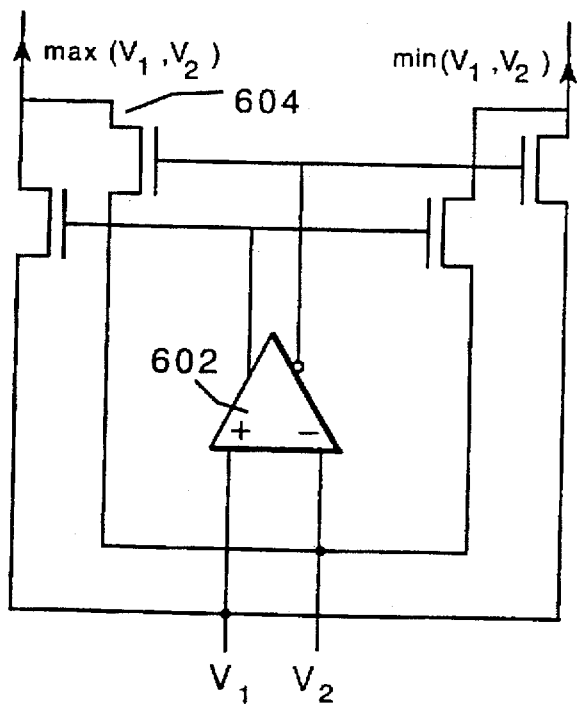

A higher resolution circuit is shown in FIG. 6. The FIG. 6 circuit transmits the highest and lowest voltages themselves instead of two internal signals proportional thereto. A conventional voltage comparator 602 compares $V_1$ and $V_2$, producing outputs indicative of which is higher. These outputs are used to drive the switches 604, to respectively turn on and off to switch through the appropriate voltages. The FIG. 6 circuit thus provides more accuracy. Such accuracy however is not always needed in median-calculating application.

Figure 7:
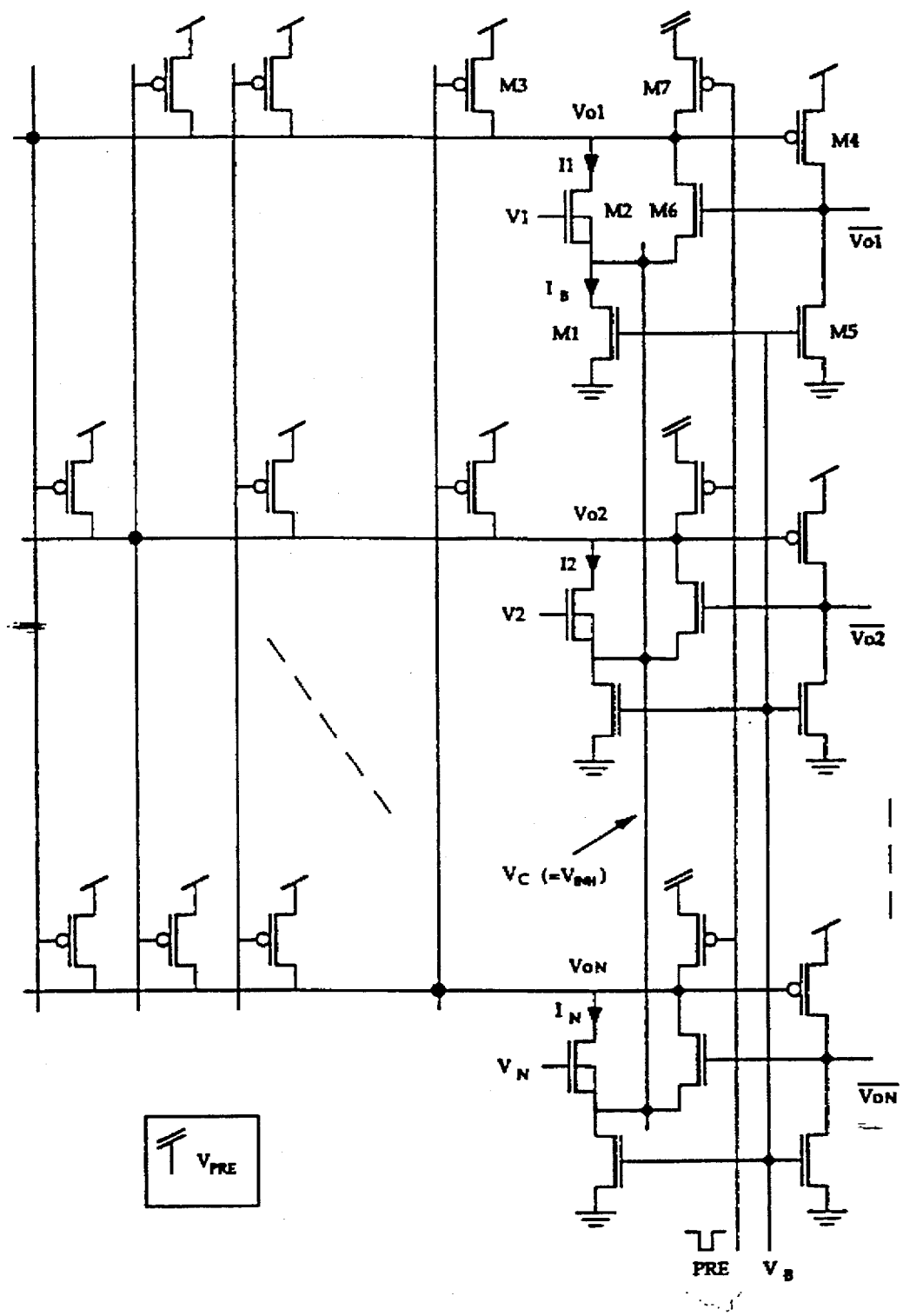
FIG. 7 shows a winner-take-all circuit.

The implementation of the present invention also uses a winner-take-all circuit which detects the highest voltage among a group. One example of the winner-take-all circuit is shown in FIG. 7. This circuit uses a network of Nx(N−1) feedback transistors to implement a high resolution N-port voltage comparator. The highest input is the winner. This can also be accomplished, for example, by any other kind of circuit including a processor or other LSI circuit.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. A median filter, comprising:
   a plurality of cells, producing outputs indicating an absolute distance between two voltages applied thereto, said plurality of cells arranged to have all samples from which the median will be detected applied thereto; and
   a circuit which detects a smallest mean absolute distance to determine the median.

2. A median filter as in claim 1, wherein each of said cells determines a higher voltage and a lower voltage among said two voltages which are applied thereto.

3. A median filter as in claim 2, further comprising a controlling element, controlling which of said higher and lower voltages are output by said cells.

4. A median filter as in claim 3, wherein said controlling element controls said output such that said higher output is output at a first time and said lower output is output at a second time, and further comprising a circuit which detects which of said higher and lower outputs are closest in voltage to one another.

5. A median filter as in claim 4, further comprising a precharge circuit, and wherein each of said plurality of cells includes a capacitor, which receives a precharge voltage at one end thereof, and serially receives the HI and LO voltages at the other end thereof.

6. A single-clock-cycle two-dimensional median filter, comprising:
   a plurality of absolute distance cells, each producing outputs proportional to an absolute distance between each input element and all the other input elements among which the median is to be determined; and
   a circuit which detects the smallest absolute distance to determine the median.

7. A median filter comprising:
   a plurality of cells, said cells arranged such that each cell receives a value to be compared and a possible median among a plurality of median values to be compared against, each cell selectively producing a highest voltage among its values to be compared and said plurality of median values, and the lowest voltage among said value to be compared and said median values;
   a plurality of first elements, each of which produces an output voltage indicative of a difference between said highest and lowest voltages; and
   a circuit element which determines smallest differences between said highest and lowest voltages to identify the proper median among said plurality of medians.

8. A circuit as in claim 7, wherein each said first element includes a capacitor, a plurality of said capacitors connected together to average a plurality of values.

9. A circuit as in claim 7, wherein said circuit element includes a winner-take-all circuit.

10. A circuit as in claim 7, wherein said circuit element is a processing circuit.

11. A method of determining a median among a number of values, comprising:
   arranging said values to apply said values to cells in a way such that each of said values are compared with each of a plurality of possible median values;
   determining, among said comparison, which of said values is closest to said median value; and
   outputting said closest value as the median value.

12. A method as in claim 11, wherein said comparing comprises precharging one end of a capacitor with a voltage, while the other side is charged with a first voltage among the voltages of a pair of voltages including said possible median value and said value to be compared;
   subsequently, while said precharge voltage is not applied to one end of said capacitor, applying a second voltage of said pair to said one end of said capacitor; and
   determining a voltage on the other end of the capacitor which indicates the lowest difference.

13. A method of determining, among a group of voltages, which two of the group are most similar, comprising:
   taking pairs from the group, and applying each said pair to a circuit which determines which of the two voltages of the pair are higher and which of the voltages of the pair are lower;

a controller, which establishes a connection between the higher voltage of the pair and one side of a capacitor, at the same time as a predetermined voltage is being applied to the other side of the capacitor, and subsequently removes said predetermined voltage from said other side and applies said lower voltage is applied to the other side of the pair; and a circuit which determine a highest voltage capacitor as being the cell which has two closest values to one another.

\* \* \* \* \*